(12) United States Patent
Lin

(10) Patent No.: US 8,988,916 B2
(45) Date of Patent: Mar. 24, 2015

(54) MEMORY STRUCTURE WITH REDUCED NUMBER OF REFLECTED SIGNALS

(71) Applicant: Eorex Corporation, Hsinchu County (TW)

(72) Inventor: Cheng-Lung Lin, Hsinchu County (TW)

(73) Assignee: Eorex Corporation, Hsinchu County (CN)

( * ) Notice: Subject to any disclaimer, the term of this patent is extended or adjusted under 35 U.S.C. 154(b) by 234 days.

(21) Appl. No.: 13/738,129

(22) Filed: Jan. 10, 2013

(65) Prior Publication Data
US 2014/0192582 A1 Jul. 10, 2014

(51) Int. Cl.
*G11C 5/06* (2006.01)
(52) U.S. Cl.
CPC . *G11C 5/06* (2013.01); *G11C 5/063* (2013.01)
USPC ................... 365/63; 326/30; 710/104
(58) Field of Classification Search
CPC .......... G06F 13/00; G11C 5/06; H03K 17/16; H05K 1/0246
USPC ................... 365/63; 326/30; 710/104
See application file for complete search history.

(56) References Cited

U.S. PATENT DOCUMENTS

| | | | | |
|---|---|---|---|---|
| 7,274,583 | B2 * | 9/2007 | Park et al. | 365/63 |
| 7,478,287 | B2 * | 1/2009 | Funaba et al. | 714/700 |
| 7,725,778 | B2 * | 5/2010 | Funaba et al. | 714/700 |
| 2006/0006516 | A1 * | 1/2006 | Funaba et al. | 257/686 |
| 2011/0010575 | A1 * | 1/2011 | Ware et al. | 713/500 |

* cited by examiner

*Primary Examiner* — Vanthu Nguyen
(74) *Attorney, Agent, or Firm* — Jackson IPG PLLC

(57) ABSTRACT

A memory structure with reduced-reflection signals at least includes a processing unit; a lumped circuit unit, connected to the processing unit; a plurality of memories, connected to the lumped circuit unit; and a reflected signal absorption unit, disposed at one end of the lumped circuit unit. Thereby, with the cooperation of the processing unit with each memory for signal transmission, the reflected signal absorption unit can be used to absorb the reflected signals so as to reduce the number of reflected signals during signal transmission, achieving the effect of stable operation for the memories.

7 Claims, 3 Drawing Sheets

MEMORY STRUCTURE WITH REDUCED NUMBER OF REFLECTED SIGNALS

BACKGROUND OF THE INVENTION

1. Field of the Invention

The present invention relates to a memory structure with reduced-reflection signals, and particularly to a memory structure with reduced-reflection signals, in which with the cooperation of the processing unit with each memory for signal transmission, the reflected signal absorption unit can be used to absorb the reflected signals so as to reduce the number of reflected signals during signal transmission, achieving the effect of stable operation for the memories.

2. Description of Related Art

A conventional memory structure usually consists of a processor, a plurality of memories connected to the processor, and a plurality of signal reflectors respectively disposed at a front end of each of the memories.

However, in terms of the above structure, it is still unable to effectively reduce the number of reflected signals in the process of signal transmission, seriously affecting the operation for the whole system. Furthermore, when the integration of multiple memories is to undertake (for example, a 32-bit memory is integrated to be a 64-bit one), at least two chips are connected. In such a situation, address areas and control areas of the multiple memories will be connected. It not only will lead to an increase in the complexity of the circuit layout, but will a substantial increase in the number of layers for the layout.

For this reason, the inventors has studied and proceeded in-depth discussion, and actively seek approaches for many years engaged in the research and experiences of related industries and manufacturing. After long-term research and efforts in development, the inventors has finally the successfully developed this invention 'memory structure with reduced number of reflected signals' which overcomes the shortages in the prior art.

SUMMARY OF THE INVENTION

A main purpose of this invention is to provide a memory structure with reduced-reflection signals, in which with the cooperation of the processing unit with each memory for signal transmission, the reflected signal absorption unit can be used to absorb the reflected signals so as to reduce the number of reflected signals during signal transmission, achieving the effect of stable operation for the memories.

In order to achieve the above and other objectives, the memory structure with reduced-reflection signals according to the invention at least includes a processing unit; a lumped circuit unit, connected to the processing unit; a plurality of memories, connected to the lumped circuit unit; and a reflected signal absorption unit, disposed at one end of the lumped circuit unit.

In one embodiment of the invention, each memory includes an address circuit, a command circuit and a control circuit which are respectively connected to the lumped circuit unit.

In one embodiment of the invention, each memory is individually connected to the lumped circuit unit.

In one embodiment of the invention, each memory is disposed on a chip to form a memory chip which is connected to the lumped circuit unit.

In one embodiment of the invention, at a front end of the lumped circuit unit is disposed another reflected signal absorption unit.

In one embodiment of the invention, the reflected signal absorption unit is disposed is a resister.

In one embodiment of the invention, when the processing unit, the lumped circuit unit, each memory and the reflected signal absorption unit is in the circuit layout, at least two address/control/command areas is provided between the processing unit and the lumped circuit unit; each memory is located on both sides of each address/control/command areas; between the lumped circuit unit and each memory is provided a ground area; and a plurality of power lines is provided between each memory and the processing unit.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended tables.

Figure 1:
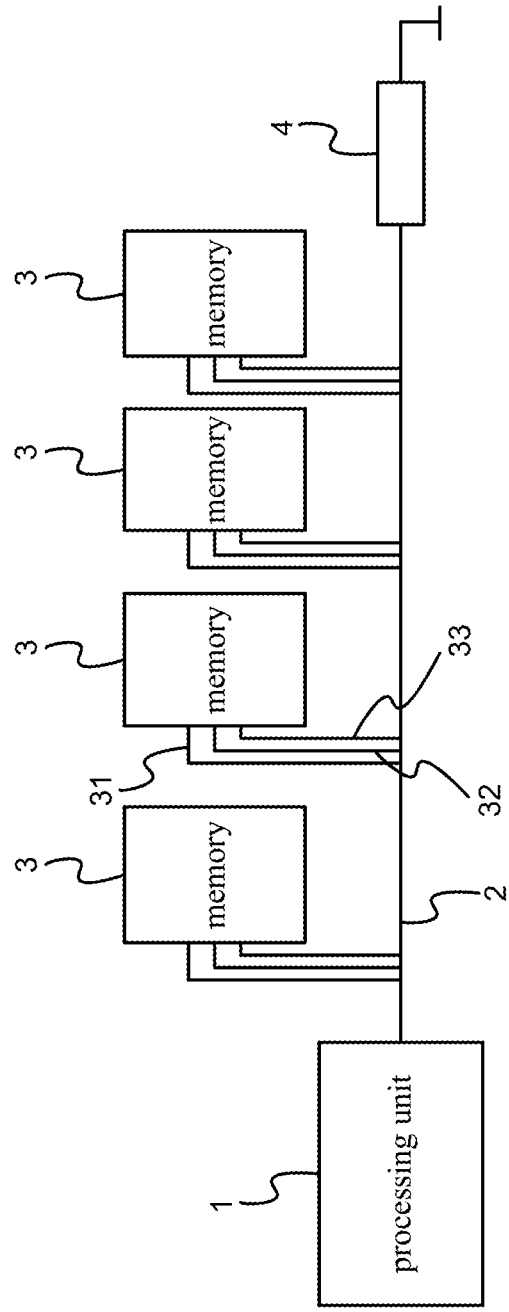
FIG. 1 is a schematic view of a memory structure with reduced number of reflected signals according to a first embodiment of the invention.

FIG. 1 is a schematic view of a memory structure with reduced number of reflected signals according to a first embodiment of the invention. As shown, the memory structure with reduced-reflection signals according to the present invention at least includes a processing unit 1, a lumped circuit unit 2, a plurality of memories 3 and a reflected signal absorption unit 4.

The processing unit 1 is used as a control center for each memory 3.

The lumped circuit unit 2 is connected to the processing unit 1.

Each memory 3 is connected to the lumped circuit unit 2, and includes an address circuit 31, a command circuit 32 and a control circuit 33 which are respectively connected to the lumped circuit unit 2. Each memory 3 is individually connected to the lumped circuits unit 2 in parallel.

The reflected signal absorption unit 4 is disposed at the end of the lumped circuit unit 2, and can be a resister. At a front end of the lumped circuit unit can be disposed another reflected signal absorption unit.

When the present invention is in use, it can be applied to related fields, such as DRAM, NAND, MRAM, NOR or SRAM. During the processing unit 1 cooperates with each of the memory address circuit 31, the command circuit 32 and the control circuit 33 for signal transmission, the reflected signal absorption unit 4 can be used to absorb the reflected signals so as to reduce the number of reflected signals in the process of signal transmission, achieving the effect of stable operation for the memories 3.

Figure 2:
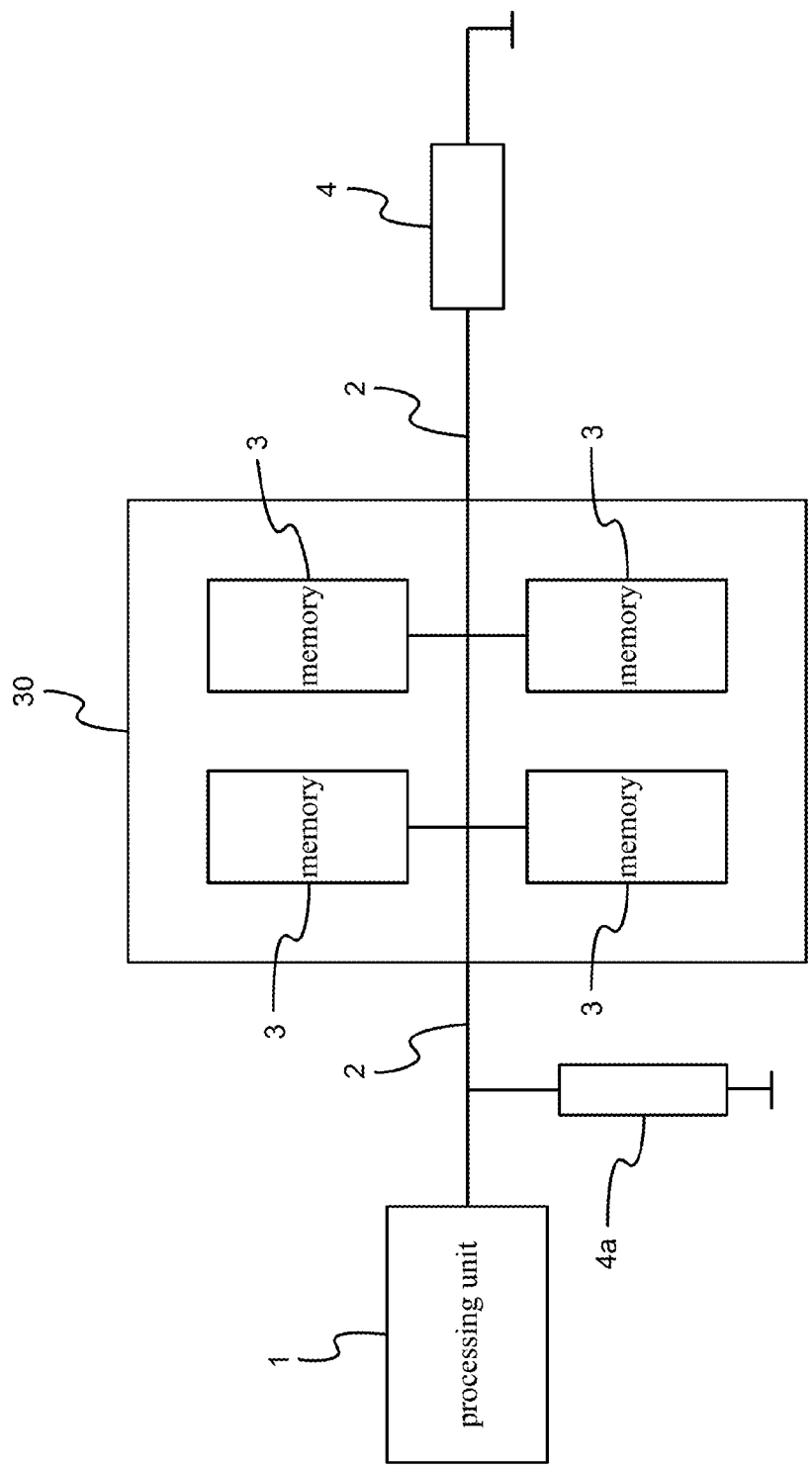
FIG. 2 is a schematic view of a memory structure with reduced number of reflected signals according to a second embodiment of the invention.

FIG. 2 is a schematic view of a memory structure with reduced number of reflected signals according to a second embodiment of the invention. As shown, the memory structure with reduced-reflection signals according to the present invention is the same as the first embodiment, except that each memory 3 is disposed on a wafer to form a memory chip 30 which is connected to the lumped circuit unit 2, and a front end and a rear end of the lumped circuit unit 2 can be respectively provided with a reflected signal absorption units 4, 4a. Thereby, with the cooperation of the processing unit 1 with each memory 3 of the memory chip 30 for signal transmission, the reflected signal absorption units 4, 4 can be used to absorb the reflected signals so as to reduce the number of reflected signals during signal transmission, achieving the effect of stable operation for the memories 3.

Figure 3:
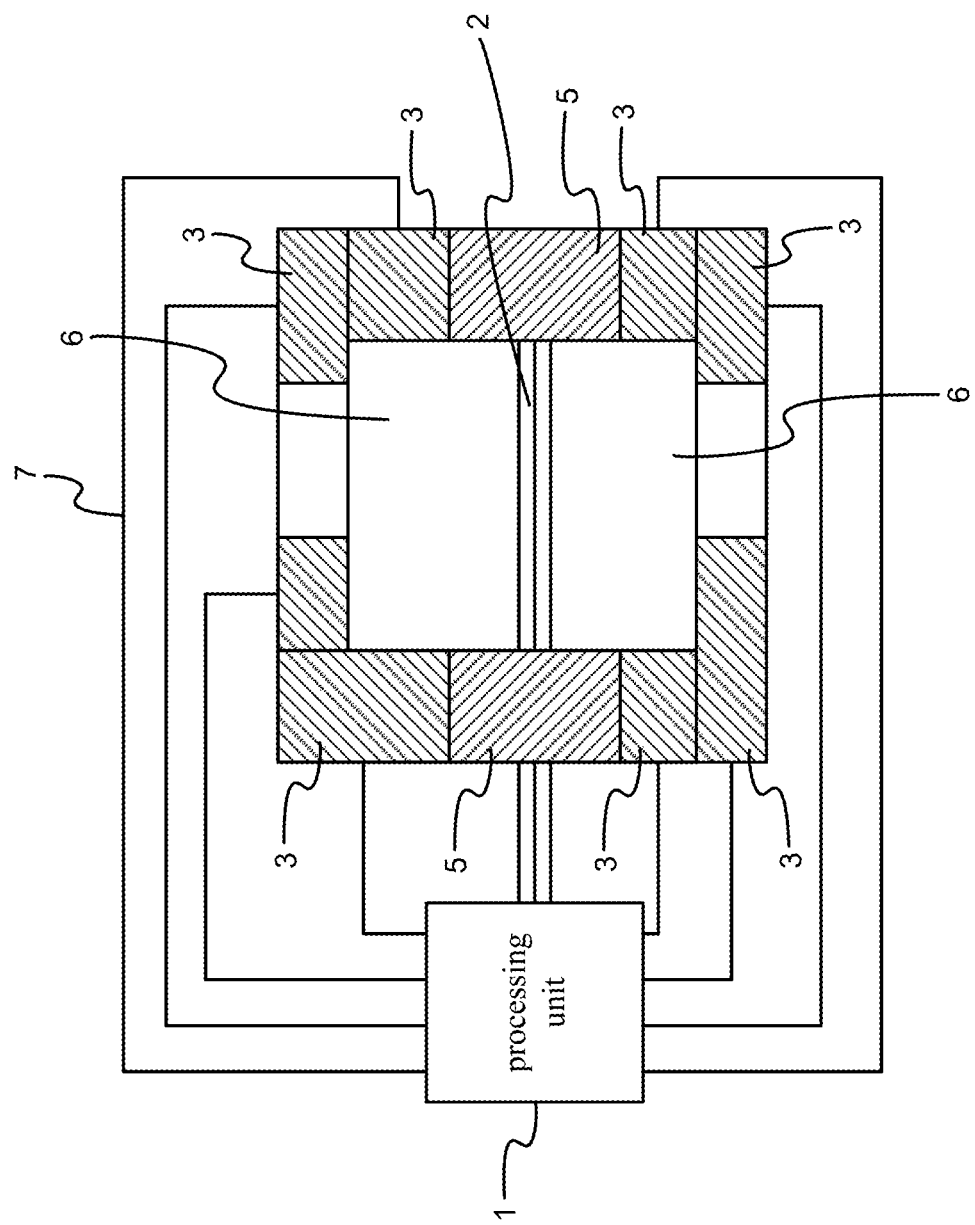
FIG. 3 is a circuit layout diagram of a memory structure with reduced number of reflected signals according to the present invention.

FIG. 3 is a circuit layout diagram of a memory structure with reduced number of reflected signals according to the present invention. As shown, when the processing unit 1, the lumped circuit unit 2, each memory 3 and the reflected signal absorption unit 4 of the present invention is in the circuit layout, at least two address/control/command areas 5 is provided between the processing unit 1 and the lumped circuit unit 2. Each memory 3 can be located on both sides of each address/control/command areas 5. Between the lumped circuit unit 2 and each memory 3 is provided a ground area 6. A plurality of power lines 7 is provided between each memory and the processing unit 1. Thereby, when several memories 3 come to integrate (for example: 32-bit memory is integrated to be a 64-bit one), the circuit layout is rendered to be easy with reduced layers for the layout.

In summary, the memory structure of reduced number of reflected signals according to the present invention can effectively improve the conventional drawbacks. With the cooperation of the processing unit with each memory for signal transmission, the reflected signal absorption unit can be used to absorb the reflected signals so as to reduce the number of reflected signals during signal transmission, achieving the effect of stable operation for the memories. This makes the invention more progressive and more practical in use which complies with the patent law.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A memory structure with reduced-reflection signals, at least comprising:
   a processing unit;
   a lumped circuit unit, connected to the processing unit;
   a plurality of memories, connected to the lumped circuit unit; and
   a reflected signal absorption unit, disposed at one end of the lumped circuit unit,
   wherein when the processing unit, the lumped circuit unit, each memory and the reflected signal absorption unit is in the circuit layout, at least two address/control/command areas is provided between the processing unit and the lumped circuit unit; each memory is located on both sides of each address/control/command areas; between the lumped circuit unit and each memory is provided a ground area; and a plurality of power lines is provided between each memory and the processing unit.

2. The memory structure of claim 1, wherein each memory comprises an address circuit, a command circuit and a control circuit which are respectively connected to the lumped circuit unit.

3. The memory structure of claim 1, wherein each memory is individually connected to the lumped circuit unit.

4. The memory structure of claim 1, wherein each memory is disposed on a chip to form a memory chip which is connected to the lumped circuit unit.

5. The memory structure of claim 4, wherein at a front end of the lumped circuit unit is disposed another reflected signal absorption unit.

6. The memory structure of claim 1, wherein the reflected signal absorption unit is disposed is a resister.

7. The memory structure of claim 5, wherein the reflected signal absorption unit is disposed is a resister.

* * * * *